United States Patent [19]

Li

[11] 4,395,728
[45] Jul. 26, 1983

[54] TEMPERATURE CONTROLLED APPARATUS

[76] Inventor: Chou H. Li, 379 Elm Dr., Roslyn, N.Y. 11576

[21] Appl. No.: 292,626

[22] Filed: Aug. 13, 1981

Related U.S. Application Data

[63] Continuation-in-part of Ser. No. 69,355, Aug. 24, 1979, abandoned.

[51] Int. Cl.³ .................. H01L 25/04; H01L 23/02; H01L 23/12
[52] U.S. Cl. .............................. 357/82; 65/32; 165/80 R; 165/104.26; 357/74
[58] Field of Search .................. 357/82, 74; 65/32; 165/80, 104.26

[56] References Cited

U.S. PATENT DOCUMENTS

| | | | |
|---|---|---|---|
| 2,780,757 | 2/1957 | Thornhill et al. | 357/82 |
| 3,225,820 | 12/1965 | Riordan | 65/32 |
| 3,399,717 | 9/1968 | Cline | 65/32 |
| 3,649,738 | 3/1972 | Andersson et al. | 357/82 |
| 3,957,107 | 5/1976 | Altoz et al. | 357/82 |
| 4,000,776 | 1/1977 | Kroebig et al. | 357/82 |
| 4,047,198 | 9/1977 | Sekhon et al. | 357/82 |
| 4,138,692 | 2/1979 | Meeker | 357/82 |
| 4,212,349 | 7/1980 | Andros et al. | 357/82 |
| 4,279,292 | 7/1980 | Swiatosz | 357/82 |
| 4,313,492 | 2/1982 | Andros et al. | 357/82 |

FOREIGN PATENT DOCUMENTS

| | | | |
|---|---|---|---|
| 52-27375 | 3/1977 | Japan | 357/82 |
| 52-67978 | 6/1977 | Japan | 357/82 |
| 52-75180 | 6/1977 | Japan | 357/82 |
| 785461 | 10/1957 | United Kingdom | 357/83 |

Primary Examiner—Andrew J. James

[57] ABSTRACT

A temperature controlled apparatus has a heat-sensitive device chip having its top and bottom major surfaces in direct thermal contact with, respectively, a metal disk and a heat-sinking substrate. A resilient sheet surrounds the chip to form a first gas-tight enclosure between the metal disk and the substrate. A rigid can encloses the assembly and contains an evaporatable liquid to complete the package. When power is applied and dissipated, the chip and metal disk get hot, heating the liquid to increase its vapor pressure, generally logarithmically, inside the can and pressurizing the metal disk. Because of the very large areal ratio between the metal disk and the chip, a pressure is induced on the chip which is greatly magnified, according to the areal ratio, from the vapor pressure.

10 Claims, 1 Drawing Figure

TEMPERATURE CONTROLLED APPARATUS

CROSS-REFERENCE TO RELATED APPLICATION

This is a continuation-in-part of my pending application, Ser. No. 69,355, filed Aug. 24, 1979 and now abandoned. I hereby incorporate by reference the above-cited reference.

BACKGROUND

1. Field

This invention relates to temperature controlled apparatus, and more particularly to temperature controlled apparatus using evaporative cooling liquids and large contact pressures induced and magnified from the liquid vapor pressures.

2. Prior Art

In conventional temperature controlled apparatus, for example, semiconductor devices particularly power devices such as power transistors, silicon controlled rectifiers, thyristers, and triacs, heat dissipation is always a very serious problem. The heat generation in the device chip at the PN junction through, for example, ohmic heating, must be conducted away through solder layers at the bottom substrate or top leads. The top leads usually do not have sufficient heat capacity or conducting power. The bottom substrate is often a ceramic disk to achieve electrical isolation. In addition, the solder layers are usually of intermetallic lead-tin alloys, which are low in thermal conductivity. Further, solder layers often dissolve gold, nickel, and silicon from the chip. Such dissolutions cause further increases in thermal resistance in the solder layers. Even worse, because of the thermal expansion mismatch between the chip and the solder layer or substrate, the solder layers are often separated from the chip and/or substrate. Thermally insulating cracks are then formed rendering efficient cooling impossible.

Recently, "translucent" devices are developed that have metal disks in direct thermal contact with the semiconductor chip. The metal disks are cooled by evaporative liquid cooling with, e.g., 3M's "fluorinert electronic liquids" Nos. FC 40, 43, 48, 70, 72, 75, 77, 78, and 104. These liquids have somewhat different physical and electrical properties but boil in the range of 2.5 to at least 56° C., and are electrically and chemically inert relative to the silicon chip.

However, to achieve high dissipation rates, high pressures must be continuously applied through the metal disks to the silicon chip. Such continuous, high pressures often result in physical and electrical failures of the silicon chips.

Accordingly, an object of this invention is to provide improved temperature controlled apparatus;

A further object of the present is to provide improved temperature controlled apparatus and methods for improved heat dissipation in these apparatus;

A broad object of this invention is to provide temperature controlled apparatus whose heat dissipation rate is automatically regulated according to the temperature and/or electrical load on the device chip in these apparatus;

A further object of the invention is to achieve high heat dissipation rates without having high pressures continuously applied onto the chip;

Another broad object of the invention is to regulate the chip-to-substrate thermal conductance according to the load on the semiconductor chip;

Yet another object of the invention is to employ evaporative liquid and regulated heat dissipation rates from the chip through automatically changed, contact pressures and thermal conductance between the chip and substrate.

SUMMARY

To these ends, the present invention provides a structure of and method for dissipating heat from a heat-sensitive and heat-generating device such as a semiconductor device, according to demand. The structure comprises a semiconductor chip making direct thermal contacts with a top metal disk and a bottom heat-sink substrate. A yieldable sheet provides a gas-tight enclosure around the chip but between the metal disk and the substrate. This assembly is then enclosed in a rigid, gas-tight can. An evaporatable liquid in this can contacts the metal disk and vaporizes the liquid under the heat on the chip and metal disk, to produce an increased vapor pressure on the metal disk. This pressure generates an induced pressure on the chip which is magnified over the vapor pressure because of the large areal ratio between the metal disk and the chip. The chip is thus pressed only when it is hot and heat is to be dissipated from it.

BRIEF DESCRIPTION

The invention and its further objects and features will be more clearly understood from the following detailed description taken in conjunction with the drawing in which the single FIGURE, FIG. 1, shows a cross-section of an improved device or apparatus according to this invention.

DETAILED DESCRIPTION

Figure 1:
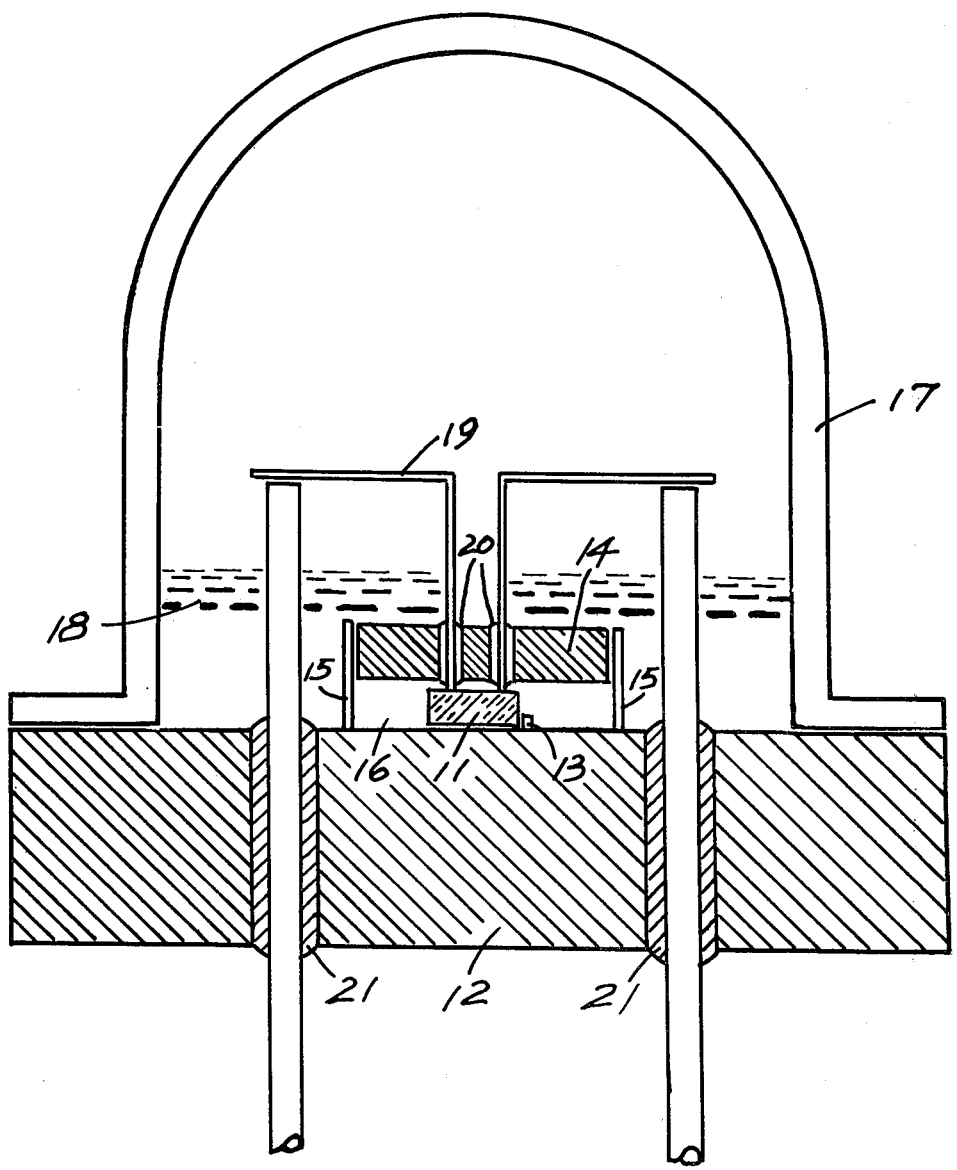

It will be understood that the specific embodiments described are merely illustrative of the general principles of the invention and that various modifications are feasible without departing from the spirit and scope of the invention. That is, the invention is of general applicability for increasing the heat dissipation rates of semiconductor devices without subjecting the devices to constant high pressure.

More particularly, it will be evident that the invention may be employed on various semiconductor devices including high or medium-power devices, or even low-power but densely packed memory or logic devices made of silicon, germanium, gallium arsenide, or other semiconductor materials.

Still further, it will be apparent that materials, structures, and methods other than those especially described can be used to practice the invention.

As shown in FIG. 1, the temperature controlled apparatus is to control the temperature of a semiconductor chip 11, such as a silicon triac chip. This chip makes a direct metal-to-metal contact with the copper heat-sinking substrate 12, without any use of intermediary and thermally resistive lead-tin solder or other intervening non-gaseous material layers as is usually the case. A tiny silicone rubber drop 13 is used to prevent lateral movement of the chip relative to the substrate. A pure molybdenum sheet 14, no more than 10 or 15 mils thick, directly contacts the top of the chip 11. To improve the thermal contacts, the surfaces of the chip, the top surface of the substrate, and the bottom surface of the sheet or disk 14, are smoothened to better than 200 microns, preferably to better than 50 or 20 microns. A resilient (silicone rubber) sheet or seal ring 15 provides a gastight, donut-shaped space or enclosure 16 around the chip 11 but between the substrate 12 and disk 14. This enclosure may be under one atmospheric pressure of air but preferably is nitrogen-filled and under a partial vacuum, e.g., 10 Torr of nitrogen. The entire assembly is covered by, and hermetically sealed with, a substantially rigid metal (nickel, copper, aluminum, or steel) sheet enclosure in the form of a welded-on, gas-tight can 17. The enclosure 17 is partially filled with an evaporative cooling liquid 18, such as 3M's FC-72 or any of the other 3M's fluorinert electronic liquids previously listed. The liquid FC-72 boils at 56° C. and has a vapor pressure highly and logarithmically dependent on the temperature T° C., i.e., $\log_{10}P$ (Torr)=7.60-1562/(T+273), where P is the vapor pressure. The can 17 has a dome-shaped top to better withstand internal pressure. The liquid is not in contact with the chip, but is separated from the chip by the resilient seal ring 15. Hence, even water may be used to practice the invention instead of FC-72 liquid. Water has a very high heat of vaporization, but also a high boiling point i.e., 100° C. As shown in FIG. 1, the level of the fluid 18 is above the top surface of the disk 14, insuring a constant physical and thermal contact between the disk 14 and chip 11 and also between the chip 11 and substrate 12.

With the above-described package, high power dissipation from the chip 11 occurs readily through heat conduction via the top and bottom, metal-metal contacts and through evaporative cooling. The heat-generated vapor pressure of water or FC-72 in the can 17 pressurizes the molybdenum sheet disk 14 against the chip 11, to reduce the thermal resistance, by an order of magnitude or more, only precisely when and to a degree needed, without constantly and unnecessarily applying the high pressure which often mechanically and electrically destroys the chip 11. Thus, more effective heat removal from the device chip via heat conduction through the substrate and plate occurs only at a time when more cooling of the device chip is needed without constantly applying unnecessarily high and damaging pressures on the device chip.

Thus, under high heat dissipation conditions, the chip gets hot and the metal disk temperature is raised. The contacting water or FC-72 vaporizes and creates a high vapor pressure inside the can 17. This vapor pressure pushes the metal sheet disk 14 against the chip 11 and substrate 12, reduce the contact resistances and increasing the thermal conductances. The chip is thus effectively cooled, according to demand.

Note that the area of the molybdenum disk 14 is many (5, 10, or more) times that of the silicon chip 11. Hence, the vapor pressure of water or FC-72 (minus the pressure in the enclosure 16) is magnified greatly by the areal ratio to produce a much higher effective or induced pressure on the silicon chip 11.

In the apparatus of the invention, the fluid (including the vaporized gas) pressure induces a magnified contact pressure on the chip. The magnification ratio equals the areal ratio of the metal disk 14 to chip 11. This is because the downward forces due to the liquid vapor pressure applied onto the disk 14-chip 13 assembly must be perfectly balanced by the upward contact pressure applied by the substrate 12 on the chip 11. This areal ratio always exceeds five times but easily exceeds 10, 20 or more times. With an evaporative cooling liquid such as FC-72, the induced pressure in the chip 11 easily exceeds many times the atmospheric pressure when the metal disk reaches 150° C., as shown in Table 1. The cooling is therefore very efficient. Other evaporative cooling liquids such as water are equally effective. Note in particular that the liquid vaporization, vaporization heat withdrawal, increased contact pressure, . . . are almost instantaneous.

TABLE 1

| Induced pressure on chip with FC-72 liquid: | | | | |
|---|---|---|---|---|
| Temp. of Disk 14, °C. | 0 | 50 | 100 | 150 |
| Vapor Press, Torr | 77.3 | 591.7 | 2624 | 8187 |
| Vapor press, Atm. | .102 | .779 | 3,474 | 10.77 |
| Induced press, with areal ratio: | | | | |
| R = 5.0, Atm. | 0.51 | 3.40 | 17.4 | 53.8 |
| R = 10.0, Atm. | 1.02 | 7.79 | 34.7 | 107.7 |
| R = 20.0, Atm. | 2.04 | 15.58 | 69.4 | 215.4 |

For an electrically insulated triac package, an opening may be provided in the molybdenum disk 14 to have a gate lead 19 insulated from the molybdenum sheet by, e.g., a glass-to-metal seal or even a drop 20 of silicone rubber. The substrate 12 has similar openings 21 for the gate and also for main terminal to come out. The joint or seal between the can 17 and substrate 12 may also be of the electrically insulating type.

Applying a porous or capillary coating of metal (copper or aluminum) on at least the inner surface of the can 17, the top surface of the molybdenum disk 14, and the top, ring-shaped area of the substrate 12 converts the above package into a heat pipe design so that the package can be used in any orientation. A heat pipe has a thermal conductance a thousand times better than that of copper of the same volume. Hence, several triac components and even a microprocessor circuit can be put into one single package, with the common enclosure 17 and cooling liquid 18 for the power handling and control of an entire home appliance such as a washing machine. In this case, many more insulated lead openings 21 are, of course, needed on the substrate.

The invention, as described above, is not to be construed as limited to the particular forms disclosed herein, since these are to be regarded as illustrative rather than restrictive.

I claim:

1. A temperature-controlled apparatus for cooling, according to demand, a heat-sensitive device having two major surfaces thereon comprising:
   a heat-sinking substrate having a substrate contact area of a fixed shape and size on the contact side thereof which is in thermal and physical contact with one of the major surfaces, the thermal resistance through the substrate contact area decreasing with increasing contact pressure between the device and the substrate;
   a heat-conductive disk having a disk contact area on one side thereof which is in thermal and physical contact with the other major surface;
   a source of an evaporatable liquid in thermal contact with the other side of the disk and whose vapor pressure increases with the temperature of the liquid;
   the heat from the device substantially instantaneously heating up the disk through heat conduction across tthe disk contact area to thereby evaporate the liquid and also increase the liquid vapor pressure on the other side of the disk;

a gas-tight and substantially rigid enclosure means enclosing at least the disk and part of the contact side of the substrate to allow the build-up of the vapor pressure of the liquid within the enclosure means;

means for preventing the vapor pressure from being applied to the one side of the disk which is in contact with the device;

the other side of the disk subjected to the liquid vapor pressure thereon being substantially greater than the substrate contact area contacting the device so that to balance the forces on the two sides of the disk the unit contact pressure between the device and the substrate must also be substantially greater than the liquid vapor pressure on the other side of the disk whereby increasing temperature on the device heats up the disk and the liquid to increase the vapor pressure on the other side of the disk and, simultaneously, to increase the contact pressure between the device and the substrate and thus to decrease the thermal resistance thereby allowing more effective heat removal from the device via heat conduction through the substrate at a time when more cooling of the device is needed, without constantly applying unnecessarily high and damaging pressure on the device.

2. The apparatus as in claim 1 wherein the other side of the disk is at least five times greater than the substrate contact area so that the unit contact pressure between the device and the substrate is also at least five times greater than the liquid vapor pressure on the other side of the disk.

3. The apparatus as in claim 2 including a layer of a heat-conductive substance forming a capillary coating covering at least the inner surface of the enclosure means, the other side of the disk, and the contact side of the substrate outside the enclosure means to thereby form a heat pipe design for the operation of the apparatus in more than one orientation.

4. The apparatus as in claim 2 wherein the device has a top and a bottom major surfaces with the one major surface being the bottom major surface and the other major surface being the top major surface, the contact side of the substrate is the top side thereof, and the one and other sides of the disk are respectively the bottom and top sides of the disk.

5. The apparatus as in claim 2 wherein the preventing means comprises a yieldable sheet providing a second gas-tight enclosure around the device but between the disk and the substrate.

6. The apparatus as in claim 2 wherein the heat-sensitive device is a semiconductor chip.

7. The apparatus as in claim 2 wherein the evaporatable liquid is water.

8. The apparatus as in claim 2 wherein the evaporatable liquid is chemically and electrically inert relative to the device.

9. The apparatus as in claim 2 wherein the two major surfaces of the device are smoothened to better than 50 microns to enhance thermal contacts.

10. The apparatus as in claim 2 wherein the contact pressure between the device and the substrate as induced by the liquid vapor pressure exceeds 3.4 atmospheres.

* * * * *